United States Patent
Kawasaki et al.

(10) Patent No.: US 11,025,267 B2
(45) Date of Patent: Jun. 1, 2021

(54) DAC AND OSCILLATION CIRCUIT

(71) Applicant: SONY SEMICONDUCTOR SOLUTIONS CORPORATION, Kanagawa (JP)

(72) Inventors: Yoshinobu Kawasaki, Kanagawa (JP); Kentaro Yasunaka, Tokyo (JP); Takashi Masuda, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/470,037

(22) PCT Filed: Dec. 14, 2017

(86) PCT No.: PCT/JP2017/044857
§ 371 (c)(1),
(2) Date: Jun. 14, 2019

(87) PCT Pub. No.: WO2018/123610
PCT Pub. Date: Jul. 5, 2018

(65) Prior Publication Data
US 2020/0091927 A1 Mar. 19, 2020

(30) Foreign Application Priority Data
Dec. 28, 2016 (JP) .............................. JP2016-254934

(51) Int. Cl.
*H03M 1/70* (2006.01)
*H03B 5/12* (2006.01)
(Continued)

(52) U.S. Cl.
CPC ............ *H03M 1/70* (2013.01); *H03B 5/1215* (2013.01); *H03B 5/1228* (2013.01);
(Continued)

(58) Field of Classification Search
CPC ...... H03M 1/765; H03M 1/662; H03M 1/785; H03M 1/70; H03M 1/808; H03M 1/66; H04M 1/76; H03B 5/124; H03B 5/1243
See application file for complete search history.

(56) References Cited

U.S. PATENT DOCUMENTS 6,448,917 B1 * 9/2002 Leung ................. H03M 1/0663
341/144
6,639,536 B2 * 10/2003 Matsuda ............... H03M 1/662
341/144

(Continued)

FOREIGN PATENT DOCUMENTS

| JP | 08-125538 A | 5/1996 |
|---|---|---|
| JP | 08125538 A * | 5/1996 |

(Continued)

OTHER PUBLICATIONS

International Search Report and Written Opinion of PCT Application No. PCT/JP2017/044857, dated Feb. 13, 2018, 08 pages of ISRWO.

*Primary Examiner* — Ryan Johnson
(74) *Attorney, Agent, or Firm* — Chip Law Group

(57) ABSTRACT

The present technology relates to a DAC (Digital to Analog Converter) and an oscillation circuit that allow widening of a range of a voltage to be output from the DAC. A plurality of first switches is connected to a voltage-dividing resistor and each configured to output, as a first voltage, a voltage at a corresponding one of connection points between the voltage-dividing resistor and the plurality of first switches. A plurality of second switches is connected to the voltage-dividing resistor and each configured to output, as a second voltage, a voltage at a corresponding one of connection points between the voltage-dividing resistor and the plurality of second switches. The present technology can be applied to, for example, a VCO (Voltage-Controlled Oscillator) and (Continued)

the like that oscillates a signal with a frequency according to a voltage to be output from a DAC.

9 Claims, 14 Drawing Sheets

(51) Int. Cl.
  *H03M 1/76* (2006.01)
  *H03M 1/78* (2006.01)
  *H03L 7/099* (2006.01)

(52) U.S. Cl.
  CPC .......... *H03B 5/1253* (2013.01); *H03M 1/765* (2013.01); *H03M 1/785* (2013.01); *H03B 2201/0283* (2013.01); *H03L 7/099* (2013.01)

(56) References Cited

U.S. PATENT DOCUMENTS

| | | | |
|---|---|---|---|
| 6,778,122 B2 * | 8/2004 | Lien | .................. H03M 1/0682 341/144 |
| 2003/0151537 A1 | 8/2003 | Matsuda et al. | |

FOREIGN PATENT DOCUMENTS

| | | | |
|---|---|---|---|
| JP | 2001-339300 A | | 12/2001 |
| JP | 2001339300 A | * | 12/2001 |
| JP | 2003-243987 A | | 8/2003 |
| JP | 2005-536095 A | | 11/2005 |

\* cited by examiner

F I G . 7
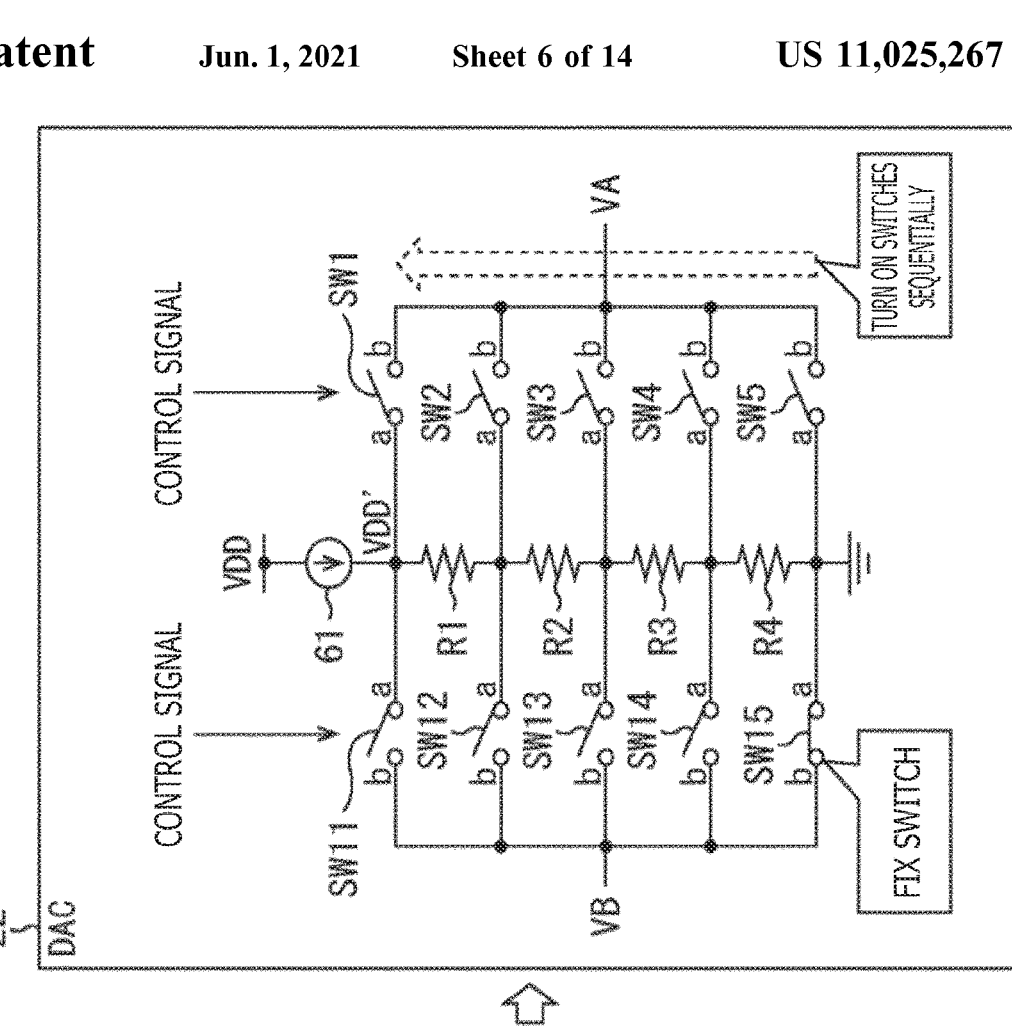
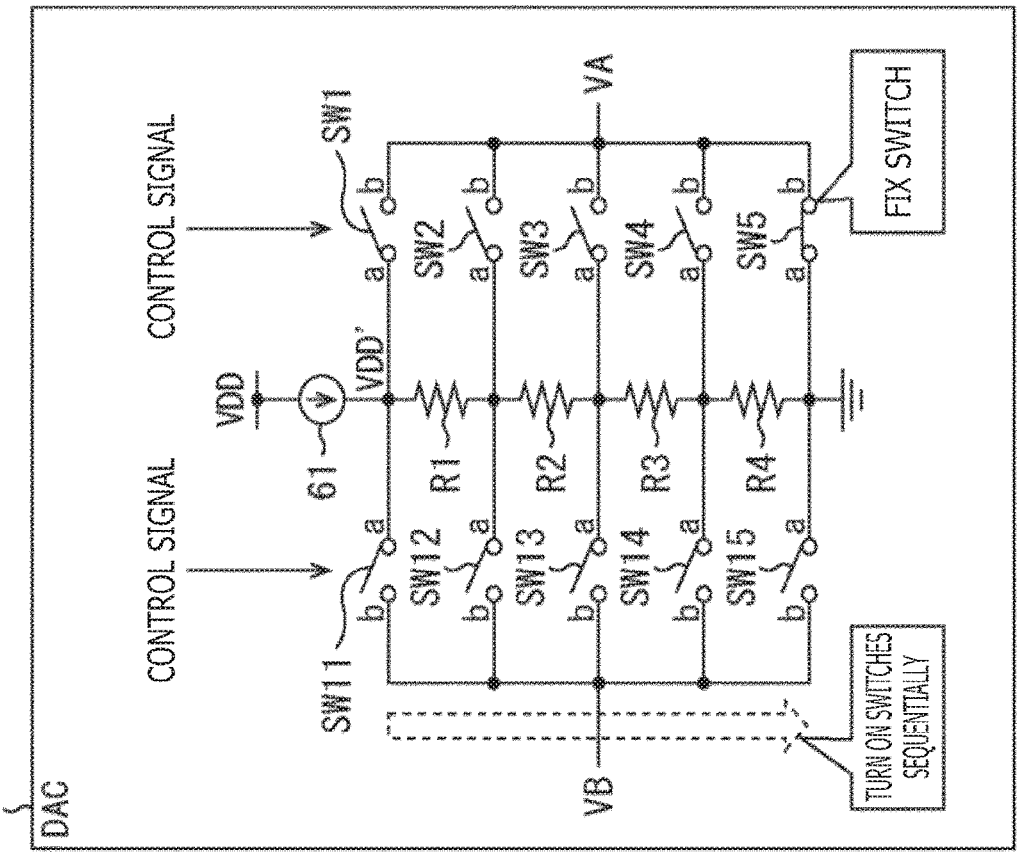

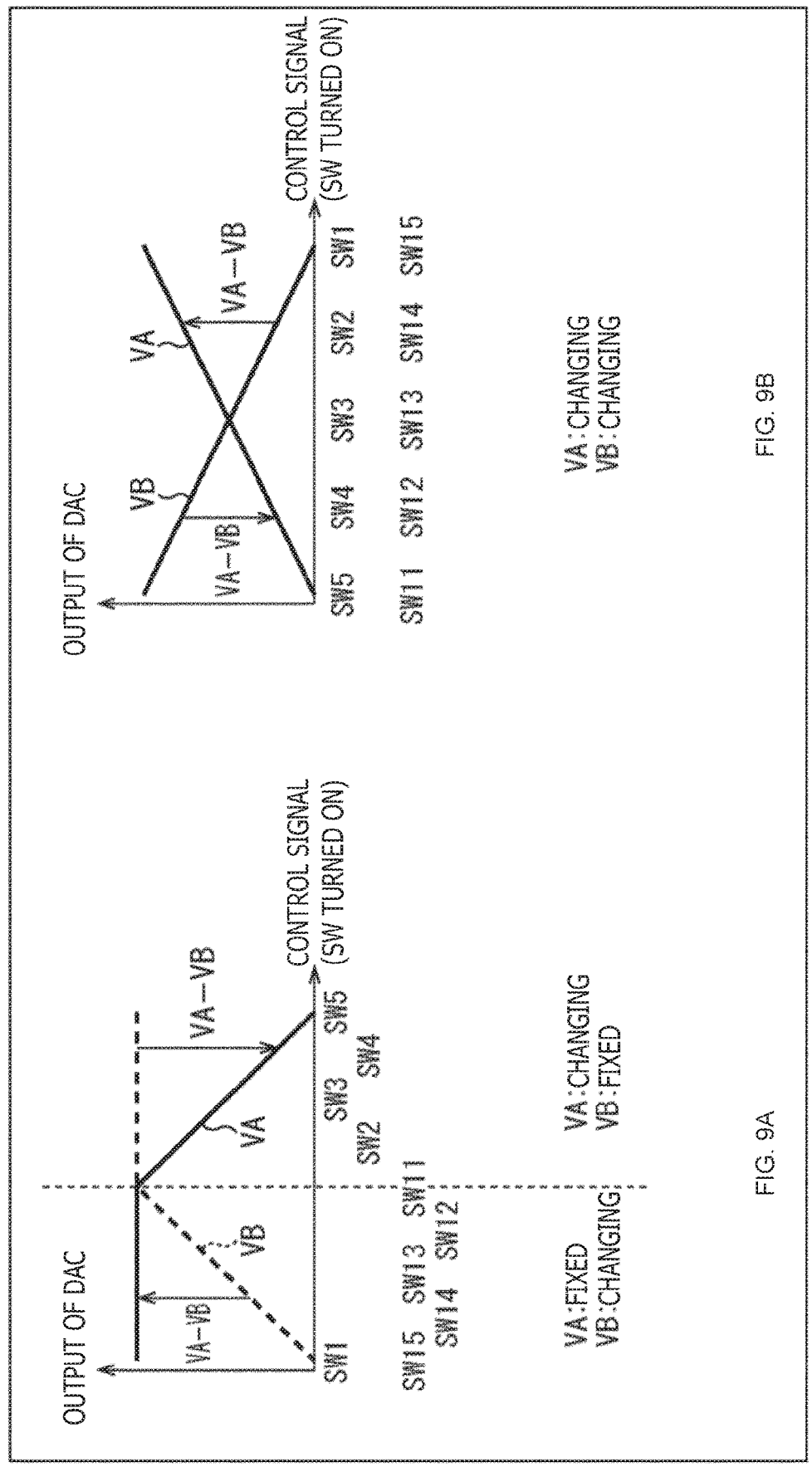

F I G. 10
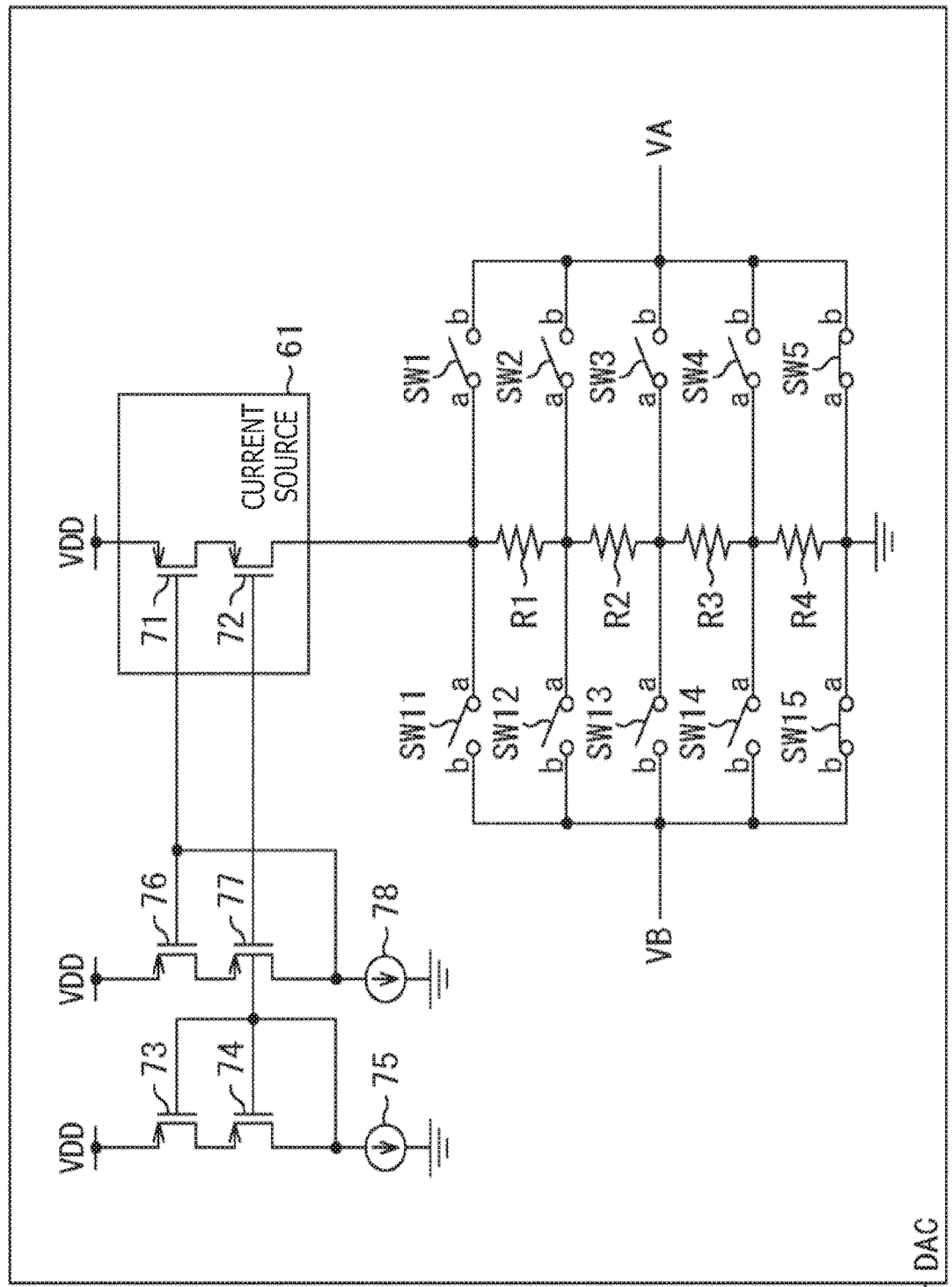

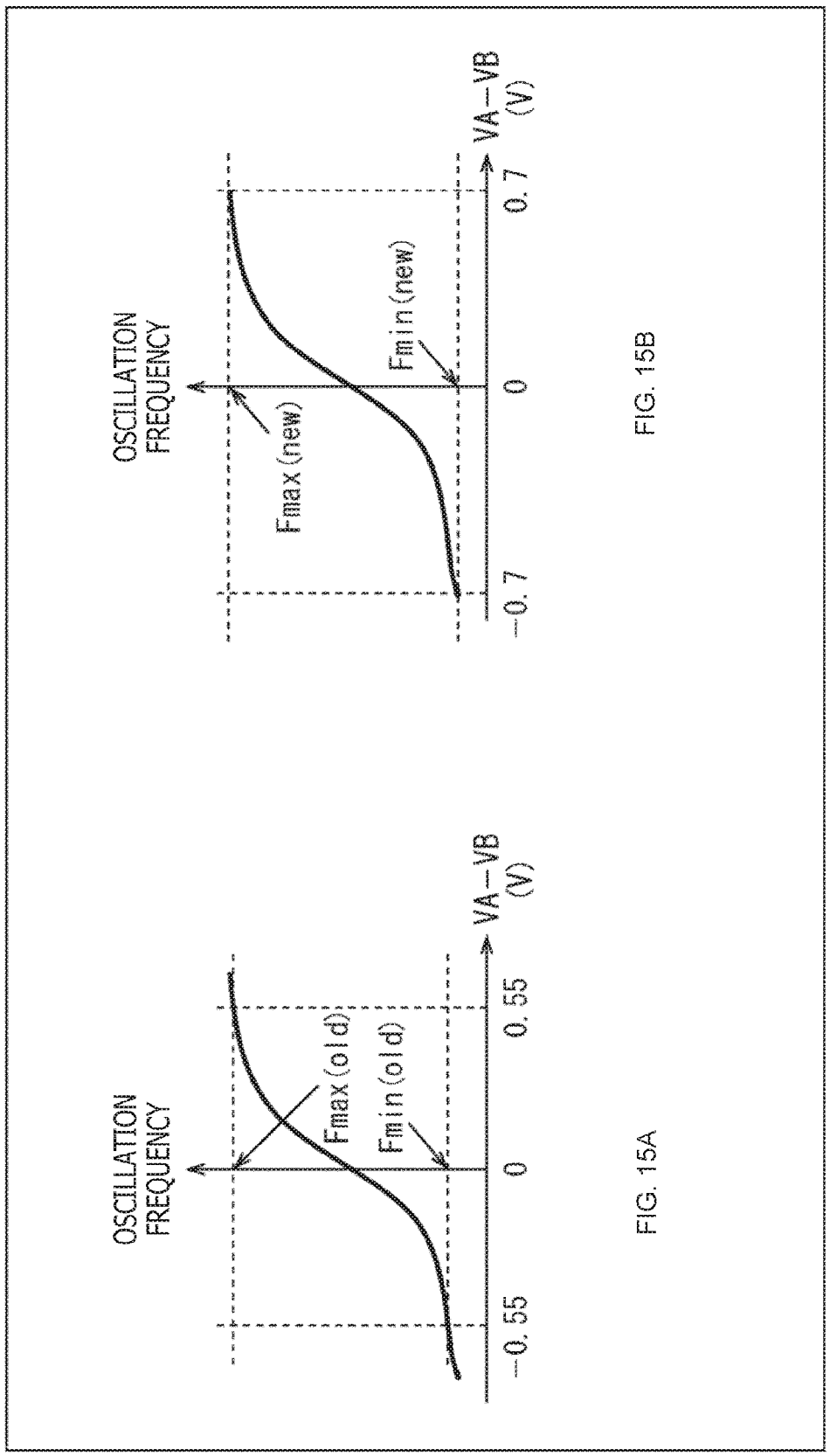

DAC AND OSCILLATION CIRCUIT

CROSS REFERENCE TO RELATED APPLICATIONS

This application is a U.S. National Phase of International Patent Application No. PCT/JP2017/044857 filed on Dec. 14, 2017, which claims priority benefit of Japanese Patent Application No. JP 2016-254934 filed in the Japan Patent Office on Dec. 28, 2016. Each of the above-referenced applications is hereby incorporated herein by reference in its entirety.

TECHNICAL FIELD

The present technology relates to a DAC (Digital to Analog Converter) and an oscillation circuit, and particularly relates to a DAC and an oscillation circuit that allow, for example, widening of a range of a voltage to be output from the DAC.

BACKGROUND ART

For example, PTL 1 proposes a method of controlling a VCO (Voltage-Controlled Oscillator) by pretuning the VCO using an analog signal output from a DAC and thereafter inputting a reference signal to the VCO to lock the VCO.

CITATION LIST

Patent Literature

[PTL 1]
JP 2005-536095T

SUMMARY

Technical Problem

The frequency of an oscillation signal to be output by oscillation of the VCO is adjusted by a voltage of an analog signal output from the DAC.

In order to widen a range of the frequency of the oscillation signal, therefore, a range of the voltage to be output from the DAC needs to be widened.

The present technology has been made in view of the situation as described above and allows widening of a range of a voltage to be output from a DAC.

Solution to Problem

A DAC according to the present technology includes: a voltage-dividing resistor; a plurality of first switches connected to the voltage-dividing resistor and each configured to output, as a first voltage, a voltage at a corresponding one of connection points between the voltage-dividing resistor and the plurality of first switches; and a plurality of second switches connected to the voltage-dividing resistor and each configured to output, as a second voltage, a voltage at a corresponding one of connection points between the voltage-dividing resistor and the plurality of second switches.

An oscillation circuit according to the present technology includes: a DAC configured to output a first voltage and a second voltage; and an oscillator configured to oscillate a signal with a frequency corresponding to a difference voltage, the difference voltage being a difference between the first voltage and the second voltage. The DAC includes: a voltage-dividing resistor; a plurality of first switches connected to the voltage-dividing resistor and each configured to output, as the first voltage, a voltage at a corresponding one of connection points between the voltage-dividing resistor and the plurality of first switches; and a plurality of second switches connected to the voltage-dividing resistor and each configured to output, as the second voltage, a voltage at a corresponding one of connection points between the voltage-dividing resistor and the plurality of second switches.

In the DAC and the oscillation circuit according to the present technology, the plurality of first switches is connected to the voltage-dividing resistor and each configured to output, as the first voltage, the voltage at a corresponding one of the connection points between the voltage-dividing resistor and the plurality of first switches. The plurality of second switches is connected to the voltage-dividing resistor and each configured to output, as the second voltage, the voltage at a corresponding one of the connection points between the voltage-dividing resistor and the plurality of second switches.

It is noted that the DAC and the oscillation circuit may be independent devices or may be internal blocks included in one device.

Advantageous Effect of Invention

According to the present technology, a range of a voltage to be output from the DAC can be widened.

It is noted that the effect described herein is not necessarily limitative, and any of the effects described in the present disclosure may be provided.

BRIEF DESCRIPTION OF DRAWINGS

FIG. 7 is a diagram for describing an example of how the DAC 22 in a voltage variable method controls switches SW1 to SW5 and switches SW11 to SW15 according to the control signal.

FIGS. 9A and 9B are diagrams depicting another example of control of the switches SW1 to SW5 and the switches SW11 to SW15 in the voltage variable method.

FIG. 10 is a circuit diagram depicting a first exemplary configuration of a current source 61.

FIGS. 15A and 15B are diagrams depicting simulation results obtained by simulating the voltage division method and the voltage variable method.

DESCRIPTION OF EMBODIMENT

<Embodiment of Transmitter to which Present Technology is Applied>

Figure 1:
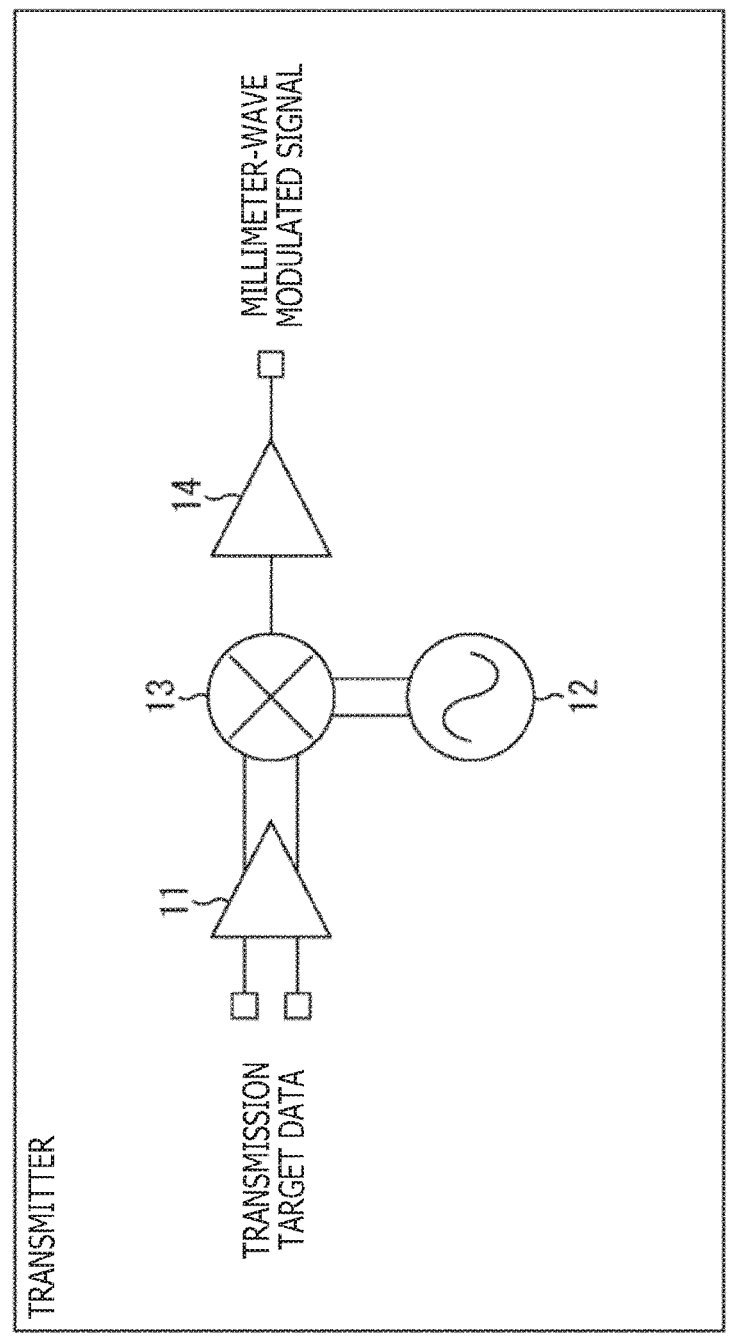
FIG. 1 is a block diagram depicting an exemplary configuration of an embodiment of a transmitter to which the present technology is applied.

FIG. 1 is a block diagram depicting an exemplary configuration of an embodiment of a transmitter to which the present technology is applied.

In FIG. 1, the transmitter includes a (baseband) amplifier 11, a VCO 12, a mixer 13, and a (power) amplifier 14. For example, the transmitter performs frequency conversion (modulation) on transmission target data, which is to be transmitted, into a millimeter-wave band signal and transmits the signal.

Here, a millimeter wave is a signal (radio wave) having a frequency of approximately 30 to 300 GHz, that is, a signal (radio wave) having a wavelength of approximately 1 to 10 mm. Since the frequency of the millimeter-wave band signal is high, data transmission can be performed at a high data rate. For example, wireless communication (wireless transmission) can be performed with a small antenna.

The amplifier 11 is supplied with transmission target data, which is a baseband signal. The amplifier 11 amplifies the transmission target data supplied thereto and supplies the amplified transmission target data to the mixer 13.

The VCO (oscillation circuit) 12 generates an oscillation signal as a carrier in a millimeter-wave band such as, for example, 57 to 66 GHz by oscillation, and supplies the oscillation signal to the mixer 13.

The mixer 13 mixes (multiplies) the transmission target data with the carrier received from the VCO 12 to modulate the carrier received from the VCO 12 according to the transmission target data, and supplies the resultant millimeter-wave modulated signal to the amplifier 14.

The mixer 13 can employ, for example, amplitude modulation (ASK (Amplitude Shift Keying)) or any other modulation method as a modulation method of modulating the carrier according to transmission target data.

The amplifier 14 amplifies and transmits the modulated signal received from the mixer 13.

<Exemplary Configuration of VCO 12>

Figure 2:
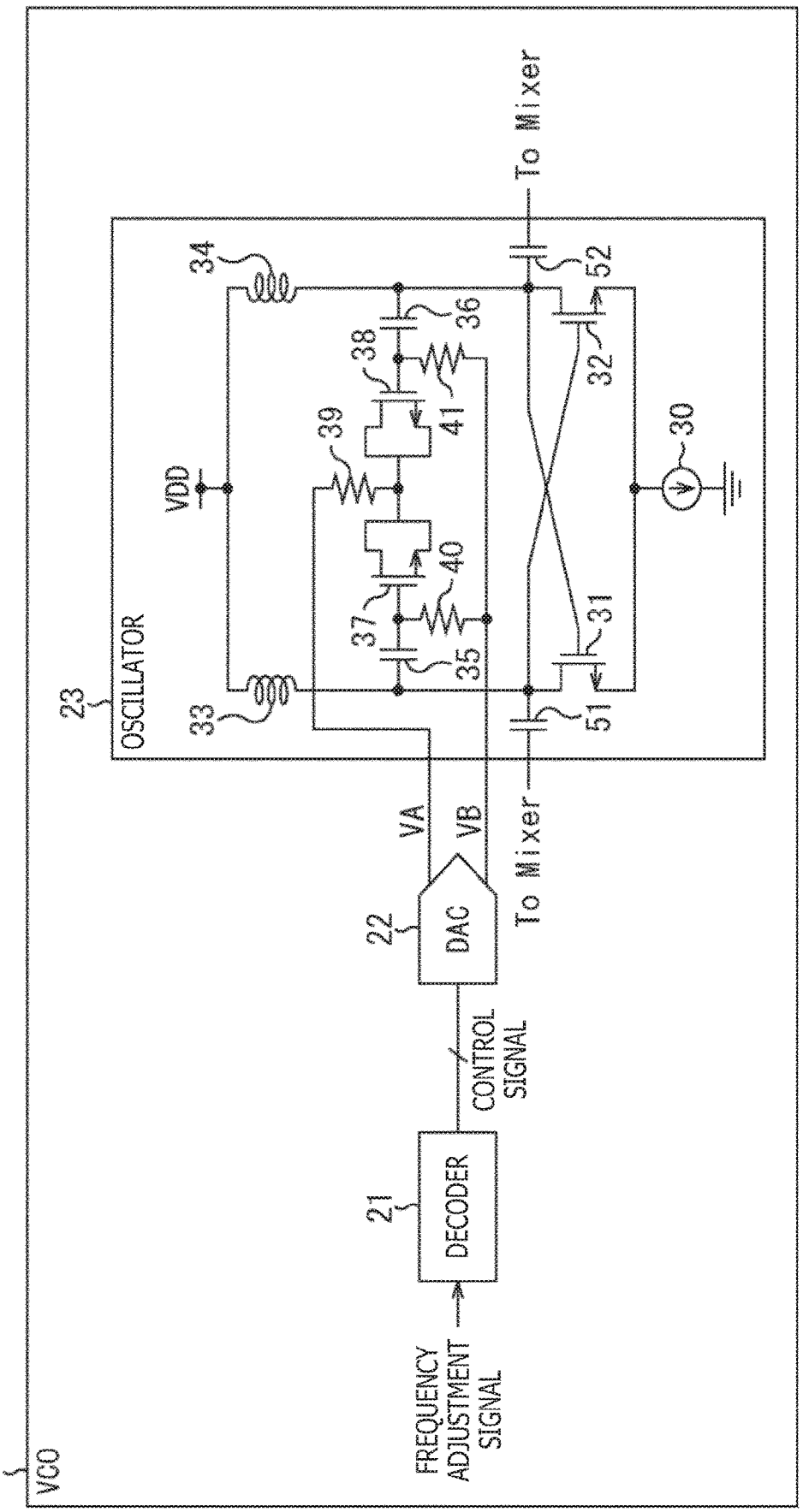
FIG. 2 is a block diagram depicting an exemplary configuration of a VCO 12.

FIG. 2 is a block diagram depicting an exemplary configuration of the VCO 12 in FIG. 1.

The VCO 12 includes a decoder 21, a DAC 22, and an oscillator 23.

From a circuit, not depicted, the decoder 21 is supplied with a frequency adjustment signal for adjusting the frequency (oscillation frequency) of an oscillation signal to be output by oscillation of the oscillator 23.

The decoder 21 decodes the frequency adjustment signal supplied thereto into a control signal and supplies the control signal to the DAC 22. The control signal is a digital signal for controlling the DAC 22.

The DAC 22 performs D/A conversion on the control signal received from the decoder 21 as a DAC code on which D/A conversion is performed, and outputs a voltage VA (first voltage) and a voltage VB (second voltage) of an analog signal corresponding to the control signal received from the decoder 21.

The voltages VA and VB output from the DAC 22 are supplied to the oscillator 23.

The oscillator 23 oscillates an oscillation signal with a frequency corresponding to a difference voltage VA−VB, for example. The difference voltage VA−VB is a difference between the voltages VA and VB received from the DAC 22.

The oscillator 23 includes a current source 30, n-channel FETs (Field-Effect Transistors) 31 and 32, coils 33 and 34, capacitors 35 and 36, varactor diodes 37 and 38, resistors 39, 40, and 41, and capacitors 51 and 52.

The current source 30 is connected to sources of the FETs 31 and 32 and provides a current to the ground such that the current obtained by adding the current flowing through the FET 31 and the current flowing through the FET 32 is kept constant.

The FETs 31 and 32 are cross-coupled to each other.

That is, a gate of the FET 31 is connected to a drain of the FET 32, while a drain of the FET 31 is connected to a gate of the FET 32.

The sources of the FETs 31 and 32 are connected to each other, and a connection point between the sources thereof is connected to the current source 30.

The current source 30 and the FETs 31 and 32 described above form a negative resistance.

One end of the coil 33 is connected to one end of the coil 34, and a connection point between the coils 33 and 34 is connected to a power supply VDD.

The other end of the coil 33 is connected through the capacitor 35 to one end of the varactor diode 37 serving as a variable capacitor. The other end of the coil 34 is connected through the capacitor 36 to one end of the varactor diode 38 serving as a variable capacitor.

The other end of the varactor diode 37 is connected to the other end of the varactor diode 38.

Here, in FIG. 2, a source and a drain of an n-channel FET are connected to each other to form the varactor diode 37. A gate of the FET serves as one end of the varactor diode 37. A connection point between the source and drain of the FET serves as the other end of the varactor diode 37.

Similarly, a source and a drain of an n-channel FET are connected to each other to form the varactor diode 38. A gate of the FET serves as one end of the varactor diode 38. A connection point between the source and drain of the FET serves as the other end of the varactor diode 38.

The coils 33 and 34, the capacitors 35 and 36, and the varactor diodes 37 and 38 described above form an LC resonant circuit. The LC resonant circuit and the negative resistance generate oscillation. Basically, the resonance frequency of the LC resonant circuit is the oscillation frequency of the VCO 12.

One end of the resistor 39 is connected to a connection point between the varactor diodes 37 and 38. The voltage VA output from the DAC 22 is applied to the other end of the resistor 39.

One end of the resistor 40 is connected to a connection point between the capacitor 35 and the varactor diode 37. The voltage VB output from the DAC 22 is applied to the other end of the resistor 40.

One end of the resistor 41 is connected to a connection point between the capacitor 36 and the varactor diode 38. The voltage VB output from the DAC 22 is applied to the other end of the resistor 41.

Therefore, the varactor diode 37 receives the difference voltage VA−VB through the resistors 39 and 40. The varactor diode 38 receives the difference voltage VA−VB through the resistors 39 and 41.

The varactor diodes 37 and 38 change the (varactor) capacitances according to the difference voltage VA−VB applied to each of the varactor diodes 37 and 38. The change in capacitances of the varactor diodes 37 and 38 causes a change in the resonance frequency of the LC resonant circuit. As a result, the oscillation frequency of the VCO 12 is adjusted.

A connection point between the coil 33 and the capacitor 35 is connected to the drain of the FET 31 forming the negative resistance. In addition, one end of the capacitor 51 is connected to the drain of the FET 31. The other end of the capacitor 51 outputs an oscillation signal generated by oscillation from the negative resistance and the LC resonant circuit.

A connection point between the coil 34 and the capacitor 36 is connected to the drain of the FET 32 forming the negative resistance. In addition, one end of the capacitor 52 is connected to the drain of the FET 32. The other end of the capacitor 52 outputs an oscillation signal generated by oscillation from the negative resistance and the LC resonant circuit.

As described above, the capacitances of the varactor diodes 37 and 38, that is, the resonance frequency of the LC resonant circuit changes according to the difference voltage VA−VB between the voltages VA and VB output from the DAC 22. Accordingly, the oscillation frequency of the oscillation signal of the VCO 12 is adjusted.

Therefore, it is necessary to widen the range of the voltage output from the DAC 22 in order to widen the range of the frequency of the oscillation signal.

<First Exemplary Configuration of DAC 22>

Figure 3:
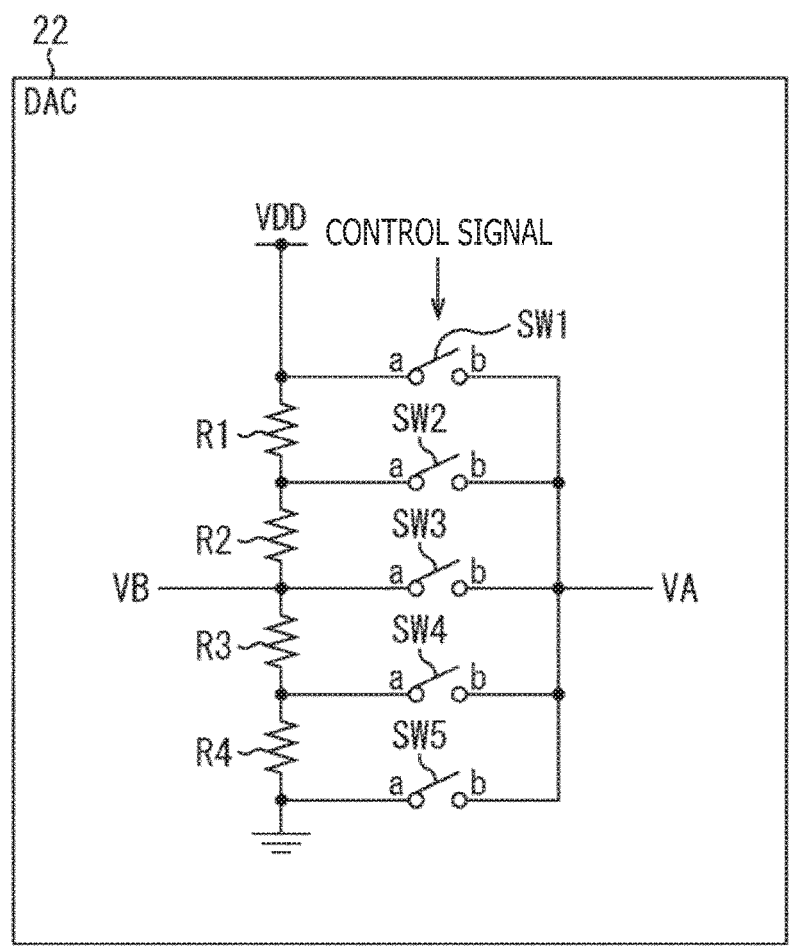
FIG. 3 is a circuit diagram depicting a first exemplary configuration of a DAC 22.

FIG. 3 is a circuit diagram depicting a first exemplary configuration of the DAC 22 in FIG. 2.

In FIG. 3, the DAC 22 includes one or more voltage-dividing resistors, namely, four resistors R1, R2, R3, and R4, and a plurality of five switches SW1, SW2, SW3, SW4, and SW5. The switches SW1 to SW5 are connected to the respective resistors R1 to R4 and each output, as the voltage VA, a voltage at a corresponding one of connection points between the resistors R1 to R4 and the switches SW1 to SW5.

It is noted that the number of voltage-dividing resistors is not limited to four and can be one or any number greater than one and other than four. The number of switches connected to the voltage-dividing resistors is also not limited to five and can be any number ranging from two to the number just one greater than the number of voltage-dividing resistors. This similarly applies to the DAC 22 having another exemplary configuration described later.

The resistors R1 to R4 are connected in series in order of the resistors R1 to R4. One end of the resistor R1, which is not connected to the resistor R2, is connected to a power supply (voltage) VDD. One end of the resistor R4, which is not connected to the resistor R3, is connected to the ground (grounded).

Each switch SW #i (i=1, 2, 3, 4, 5) is turned on/off according to a control signal supplied from the decoder 21 (FIG. 2) to turn on/off (short-circuit/open) a corresponding connection between a terminal a and a terminal b.

Terminals a of the switches SW1 to SW4 are connected to respective terminals of the resistors R1 to R4, which are the terminals on the power supply VDD side of the resistors R1 to R4. A terminal a of the switch SW5 is connected to a terminal of the resistor R4, which is the terminal on the ground side of the resistor R4.

Terminals b of the switches SW1 to SW5 are connected to each other.

The DAC 22 configured as described above outputs, as the voltage VA, a voltage at one of connection points between the terminals b of the switches SW1 to SW5 while outputting, as the voltage VB, a voltage at a connection point between the resistor R2 and the resistor R3.

According to a frequency adjustment signal, the decoder 21 (FIG. 2) outputs a control signal to turn on one switch SW #i among the switches SW1 to SW5 and turn off the remaining four switches SW #j (i≠j).

Now, assuming that resistance values of the resistors R1 to R4 are the same, the voltage VB is VDD/2 (in theory). Further, when one of the switches SW1 to SW5 is on, the corresponding voltage VA is VDD, VDD×¾, VDD×½, VDD×¼, or 0, respectively.

Therefore, the difference voltage VA−VB in the range of −VDD/2 to +VDD/2 can be output from the DAC 22 in FIG. 3.

The DAC 22 in FIG. 3 divides the power supply voltage VDD by the resistors R1 to R4 to generate the difference voltage VA−VB (the voltages VA and VB to be the difference voltage VA−VB). Thus, the method for performing D/A conversion on the control signal by which the DAC 22 in FIG. 3 generates the difference voltage VA−VB will also be referred to as a voltage division method.

It is noted that in FIG. 3, although each of the five switches SW1 to SW5, which is the number just one greater than the number of four voltage-dividing resistors R1 to R4, is connected to the corresponding one of the terminals of the four resistors R1 to R4 connected in series, the switches SW #i may not necessarily be connected to the terminals of all the voltage-dividing resistors R1 to R4.

That is, in FIG. 3, the DAC 22 can be configured without the switch SW2 or SW4, for example.

Incidentally, in the voltage division method, the voltages VA and VB, that is, the difference voltage VA−VB is directly affected by the fluctuation of the power supply voltage VDD. Therefore, the fluctuation of the power supply voltage VDD causes a fluctuation in the oscillation frequency of (the oscillator 23 of) the VCO 12 adjusted by the difference voltage VA−VB. In the VCO 12 in which a millimeter-wave carrier is generated (occurs), the fluctuation in the power supply voltage VDD results in a large fluctuation in the oscillation frequency.

<Second Exemplary Configuration of DAC 22>

Figure 4:
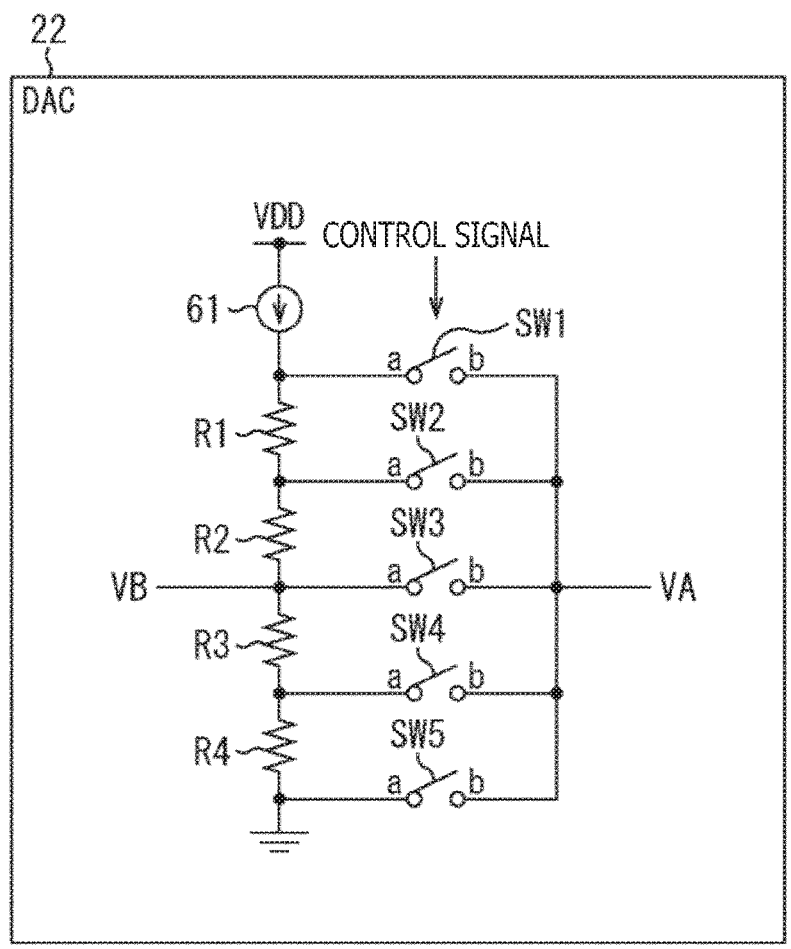
FIG. 4 is a circuit diagram depicting a second exemplary configuration of the DAC 22.

FIG. 4 is a circuit diagram depicting a second exemplary configuration of the DAC 22 in FIG. 2.

It is noted that in the figure, components corresponding to those in FIG. 3 are denoted with the same reference signs, and hereinafter, the description thereof will be appropriately omitted.

In FIG. 4, the DAC 22 includes the voltage-dividing resistors R1 to R4, the switches SW1 to SW5, and a current source 61.

Therefore, the DAC 22 in FIG. 4 is common to the DAC 22 in FIG. 3 in that the resistors R1 to R4 and the switches SW1 to SW5 are provided.

However, the DAC 22 in FIG. 4 is different from the DAC 22 in FIG. 3 in that the current source 61 is newly provided.

In FIG. 4, the current source 61 is provided between the power supply VDD and the resistor R1 and provides a constant current to the resistors R1 to R4 connected in series. Therefore, a voltage drop across each of the resistors R1 to R4 (ideally) stays constant regardless of the fluctuation of the power supply voltage VDD. Accordingly, the fluctuation of the oscillation frequency of the VCO 12 caused by the fluctuation of the power supply voltage VDD as in the voltage division method can be suppressed.

In the DAC 22 in FIG. 4, the difference voltage VA−VB is generated by the current of the current source 61 flowing through the resistors R1 to R4. Therefore, the method for performing D/A conversion on the control signal by which the DAC 22 in FIG. 4 generates the difference voltage VA−VB will also be referred to as a current source method.

In both the voltage division method in FIG. 3 and the current source method in FIG. 4, the voltage VA becomes the maximum voltage when the switch SW1 is on (and the switches SW2 to SW5 are off).

However, although the maximum voltage of the voltage VA is the power supply voltage VDD in the voltage division method in FIG. 3, the maximum voltage of the voltage VA is a voltage lower than the power supply voltage VDD by the voltage drop across the current source 61 in the current source method in FIG. 4.

Therefore, the range of the difference voltage VA−VB in the current source method is narrower than the range of the difference voltage VA−VB in the voltage division method. This eventually results in narrowed range of the oscillation frequency of the VCO 12.

Figure 5:
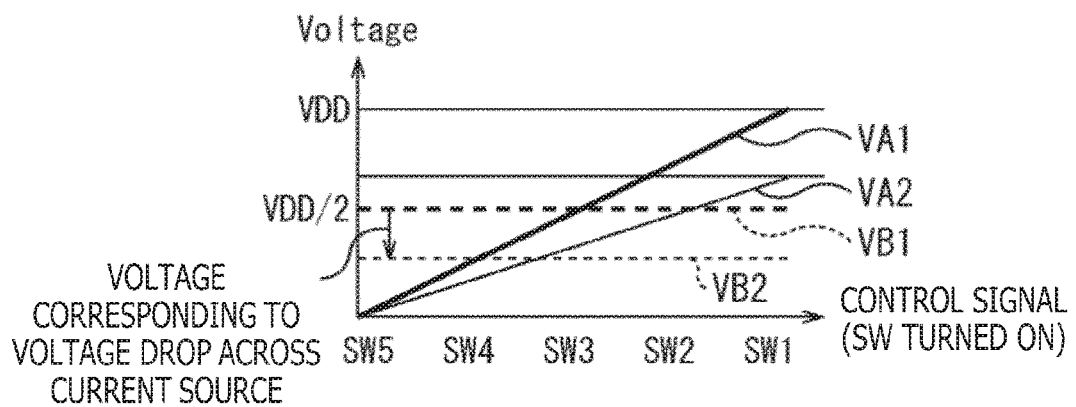
FIG. 5 is a diagram depicting a relationship between voltages VA and VB and a control signal (on/off of switches SW #i) for a voltage division method and a current source method.

FIG. 5 is a diagram depicting a relationship between the voltages VA and VB and the control signal (on/off of the switches SW #i) for the voltage division method and the current source method.

In FIG. 5, the horizontal axis represents the control signal, that is, the switch SW #i turned on according to the control signal. The vertical axis represents the voltage.

Further, in FIG. 5, straight lines VA1 and VB1 represent the voltages VA and VB in the voltage division method. Straight lines VA2 and VB2 represent the voltages VA and VB in the current source method.

In both the voltage division method and the current source method, the voltage VB is a voltage at the connection point between the resistors R2 and R3. Therefore, the voltage VB is a constant voltage regardless of on/off of the switches SW1 to SW5.

However, the voltage VB (VB2) in the current source method is lower than the voltage VB (VB1) in the voltage division method by the voltage corresponding to the voltage drop across the current source 61.

In both the voltage division method and the current source method, the voltage VA monotonically increases as the switches SW1 to SW5 are turned on (one by one) in order of the switches SW5 to SW1.

However, the ratio of the change in the voltage VA (VA2) in the current source method is smaller than the ratio of the change in the voltage VA (VA1) in the voltage division method by the ratio corresponding to the voltage drop across the current source 61. The maximum voltage of the voltage VA (VA2) in the current source method is lower than the voltage VA (VA1) in the voltage division method by the voltage drop across the current source 61.

<Third Exemplary Configuration of DAC 22>

Figure 6:
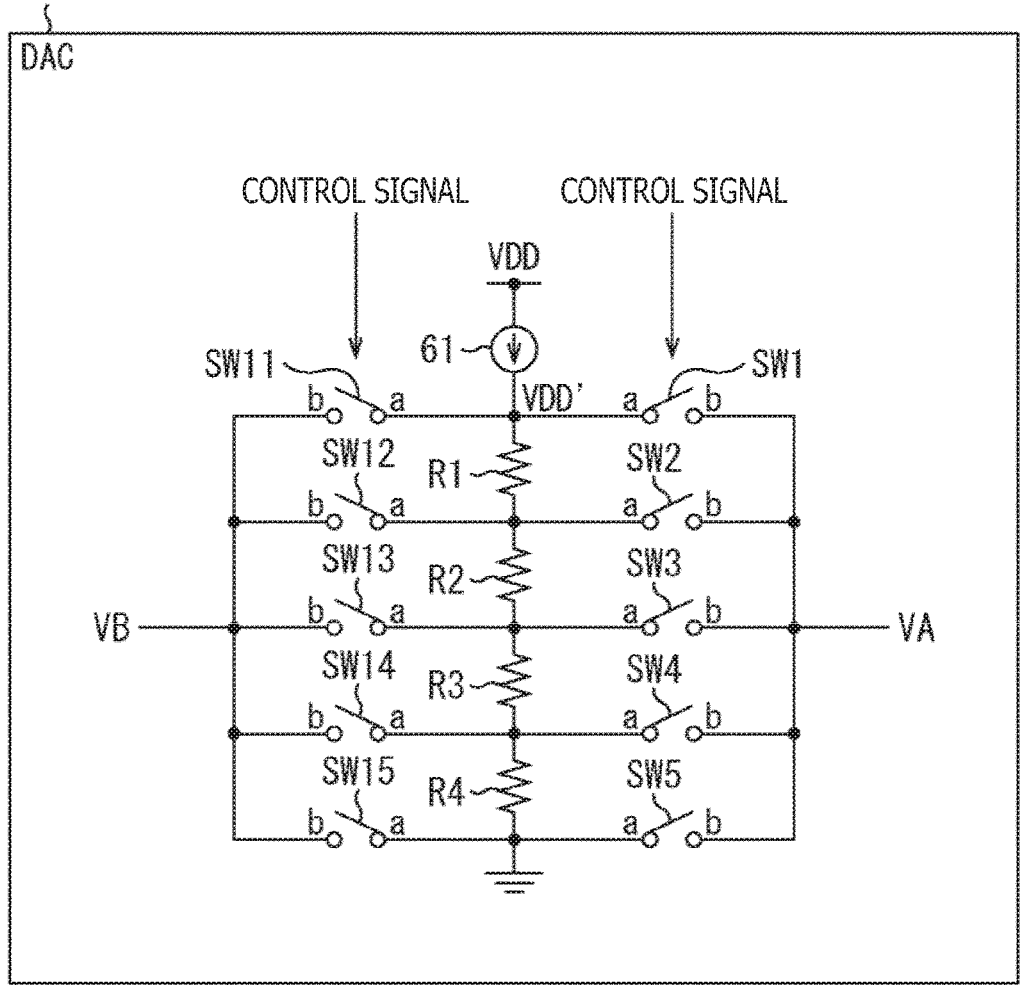
FIG. 6 is a circuit diagram depicting a third exemplary configuration of the DAC 22.

FIG. 6 is a circuit diagram depicting a third exemplary configuration of the DAC 22 in FIG. 2.

It is noted that in the figure, components corresponding to those in FIG. 3 or 4 are denoted with the same reference signs, and hereinafter, the description thereof will be appropriately omitted.

In FIG. 6, the DAC 22 includes the voltage-dividing resistors R1 to R4, the switches SW1 to SW5, the current source 61, and switches SW11, SW12, SW13, SW14, and SW15.

Therefore, the DAC 22 in FIG. 6 is common to the DAC 22 in FIG. 4 in that the resistors R1 to R4, the switches SW1 to SW5, and the current source 61 are provided.

However, the DAC 22 in FIG. 6 is different from the DAC 22 in FIG. 4 in that the switches SW11 to SW15 are newly provided.

Here, in FIG. 6, the DAC 22 can be configured without the current source 61, similarly to the DAC 22 in FIG. 3.

In a case where the DAC 22 includes the current source 61 as depicted in FIG. 6, the range of the difference voltage VA−VB is narrow due to the voltage drop across the current source 61. However, similarly to the DAC 22 in the current source method in FIG. 4, it is possible to suppress the fluctuation of the oscillation frequency of the VCO 12 caused by the fluctuation of the power supply voltage VDD.

By contrast, in a case where the DAC 22 in FIG. 6 is configured without the current source 61, the fluctuation of the power supply voltage VDD fluctuates the oscillation frequency of the VCO 12 similarly to the DAC 22 in the voltage division method in FIG. 3. However, it is possible to widen the range of the difference voltage VA−VB since no voltage drop occurs across the current source 61.

The DAC 22 in FIG. 6 includes the switches SW11 to SW15. With this configuration, it is possible to make the range of the difference voltage VA−VB wider than the range of the difference voltage VA−VB in the voltage division method in FIG. 3 and the current source method in FIG. 4.

In FIG. 6, the switches SW11 to SW15 are connected to the respective resistors R1 to R4, similarly to the switches SW1 to SW5, and each output, as the voltage VB, a voltage at a corresponding one of connection points between the switches SW11 to SW15 and the resistors R1 to R4.

That is, each switch SW #i (i=11, 12, 13, 14, 15) is turned on/off according to a control signal supplied from the decoder 21 (FIG. 2) to turn on/off a corresponding connection between a terminal a and terminal b.

Terminals a of the switches SW11 to SW14 are connected to the respective terminals of the resistors R1 to R4, which are the terminals on the power supply VDD side of the resistors R1 to R4. A terminal a of the switch SW15 is connected to the terminal of the resistor R4, which is the terminal on the ground side of the resistor R4.

Terminals b of the switches SW11 to SW15 are connected to each other.

The DAC 22 configured as described above outputs, as the voltage VA, a voltage at one of the connection points between the terminals b of the switches SW1 to SW5 while outputting, as the voltage VB, a voltage at one of the connection points between the terminals b of the switches SW11 to SW15.

According to the frequency adjustment signal, the decoder (FIG. 2) outputs a control signal to turn on one switch SW #i among the switches SW1 to SW5 and turn off the remaining four switches SW #j (i≠j) while turning on one switch SW #i' among the switches SW11 to SW15 and turning off the remaining four switches SW #j' (i'≠j').

Now, a voltage at a connection point between the current source 61 and the resistor R1 is denoted as VDD' and the resistance values of the resistors R1 to R4 are assumed to be the same. In this case, when one of the switches SW1 to SW5 is on, the corresponding voltage VA is VDD', VDD'×¾, VDD'×½, VDD'×¼, or 0, respectively. Similarly, when one of the switches SW11 to SW15 is on, the corresponding voltage VB is VDD', VDD'×¾, VDD'×½, VDD'×¼, or 0, respectively.

As described above, the maximum voltage of the voltages VA and VB is VDD' and the minimum voltage of the voltages VA and VB is 0. Therefore, the difference voltage VA−VB in the range of −VDD' (=0−VDD') to +VDD' (=VDD'−0) can be output from the DAC 22 in FIG. 6.

In the DAC 22 in FIG. 6, both of the voltages VA and VB are variable. Thus, the method for performing D/A conversion on the control signal by which the DAC 22 in FIG. 6 generates the difference voltage VA−VB will also be referred to as a voltage variable method.

FIG. 7 is a diagram for describing an example of how the DAC 22 in the voltage variable method in FIG. 6 controls the switches SW1 to SW5 and the switches SW11 to SW15 according to the control signal.

When the DAC 22 in the voltage variable method adjusts the oscillation frequency of the VCO 12, the DAC 22 controls the switches SW1 to SW5 and the switches SW11 to SW15 such that one of the voltages VA and VB is fixed while the other one of the voltages VA and VB is changed, for example.

For example, in a case where the difference voltage VA−VB is to be changed so as to be increased monotonically, only the switch SW5 among the switches SW1 to SW5 for outputting the voltage VA is turned on, while the switches SW11 to SW15 for outputting the voltage VB are turned on (one by one) in order of the switches SW11 to SW15, as indicated by a dotted arrow in FIG. 7.

In this case, the voltage VA is fixed to 0, which is the minimum voltage of the voltages VA and VB, while the voltage VB changes from VDD' to 0. As a result, the difference voltage VA−VB monotonically increases from −VDD' (=0−VDD') to 0 (=0−0).

After that, only the switch SW15 among the switches SW11 to SW15 for outputting the voltage VB is turned on, while the switches SW1 to SW5 for outputting the voltage VA are turned on in order of the switches SW5 to SW1, as depicted by a dotted arrow in FIG. 7.

In this case, the voltage VB is fixed to 0, which is the minimum voltage of the voltages VA and VB, while the voltage VA changes from 0 to VDD'. As a result, the difference voltage VA−VB monotonically increases from 0 (=0−0) to +VDD' (=VDD'−0).

Figure 8A:
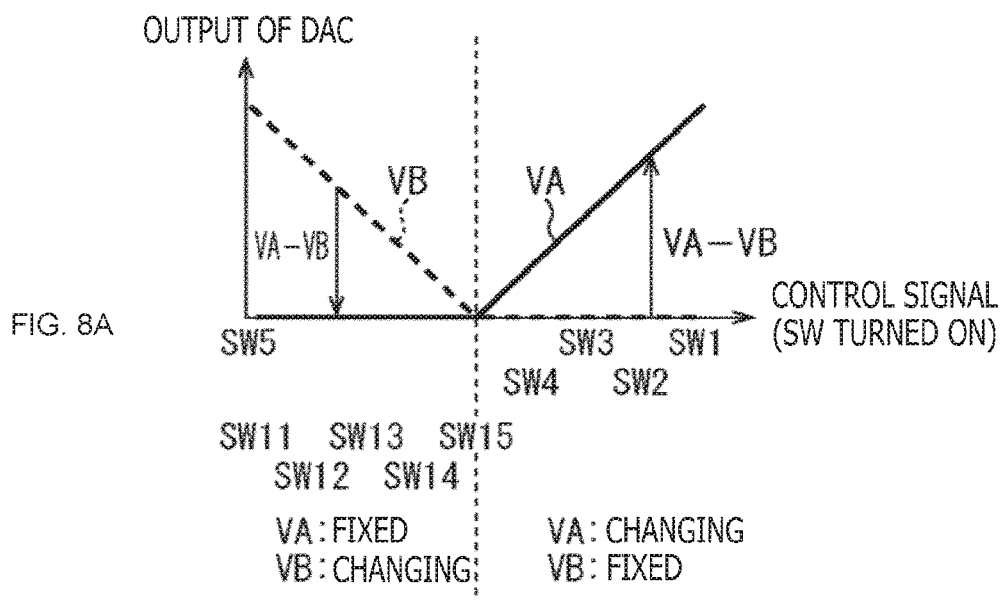
FIGS. 8A and 8B are diagrams depicting an example of control of the switches SW1 to SW5 and the switches SW11 to SW15 in the voltage variable method.
Figure 8B:
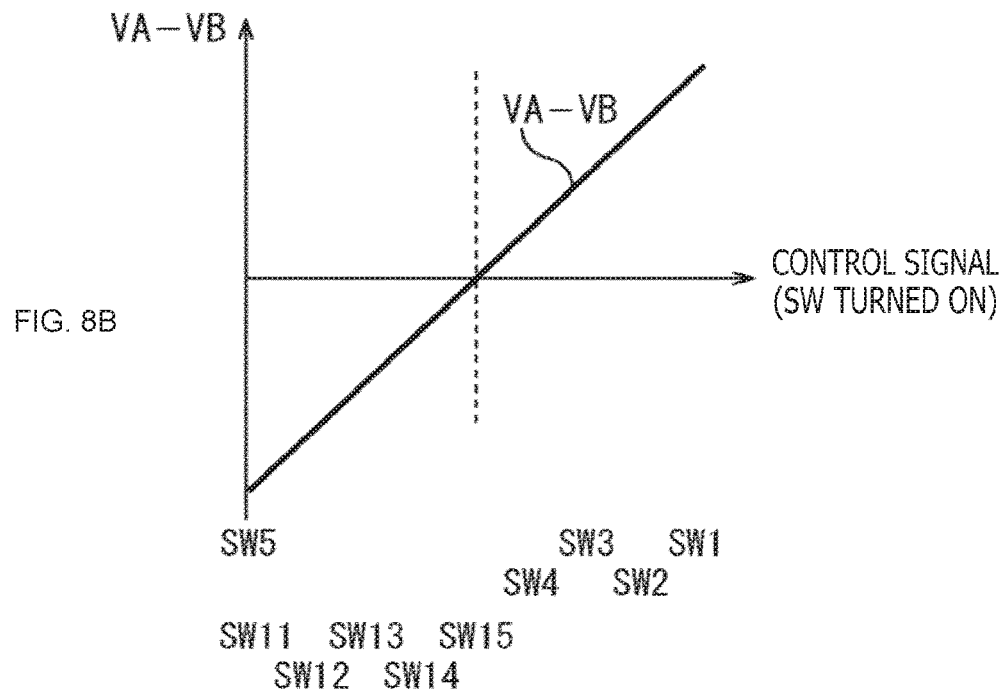

FIGS. 8A and 8B are diagrams depicting an example of control of the switches SW1 to SW5 and the switches SW11 to SW15 in the voltage variable method.

That is, FIGS. 8A and 8B depict a relationship between the voltages VA and VB and the difference voltage VA−VB in the voltage variable method and the control signal (on/off of the switch SW #i).

In FIGS. 8A and 8B, the horizontal axis represents the control signal, that is, the switch SW #i turned on according to the control signal. The vertical axis represents the voltage.

FIG. 8A depicts an example of the voltages VA and VB in a case where the difference voltage VA VB is changed so as to be increased monotonically.

In FIG. 8A, as described in FIG. 7, only the switch SW5 among the switches SW1 to SW5 is turned on, while the switches SW11 to SW15 are turned on in the order of the switches SW11 to SW15.

In this case, the voltage VA is fixed to 0, which is the minimum voltage of the voltages VA and VB, while the voltage VB changes from VDD' to 0.

Turning on the switch SW15 causes the voltage VB to be 0. Thereafter, with the switch SW15 continuing to be on, the switches SW1 to SW5 are turned on in the order of the switches SW5 to SW1.

In this case, the voltage VB is fixed to 0, which is the minimum voltage, while the voltage VA changes from 0 to VDD'.

FIG. 8B depicts an example of the difference voltage VA−VB monotonically increasing.

As described in FIG. 8A, the difference voltage VA−VB monotonically increases from −VDD' (=0−VDD') to +VDD' (=VDD'−0) by controlling the switches SW1 to SW5 and the switches SW11 to SW15, as depicted in FIG. 8B.

In a case where the DAC 22 in the voltage variable method includes the current source 61 as depicted in FIG. 6, the range of the difference voltage VA−VB is twice the range of the difference voltage VA−VB in the current source method in FIG. 4 (in theory). Further, in a case where the DAC 22 in the voltage variable method does not include the current source 61 depicted in FIG. 6, the range of the difference voltage VA−VB is twice the range of the difference voltage VA−VB in the voltage division method in FIG. 3.

Therefore, the voltage variable method can widen the range of the difference voltage VA−VB, making it possible to adjust the oscillation frequency of the VCO 12 to a wide range of frequencies.

FIGS. 9A and 9B are diagrams depicting another example of control of the switches SW1 to SW5 and the switches SW11 to SW15 in the voltage variable method.

In FIGS. 9A and 9B, the horizontal axis represents the control signal, that is, the switch SW #i turned on according to the control signal. The vertical axis represents the voltage.

Here, although in FIGS. 7, 8A, and 8B, one of the voltages VA and VB is fixed to the minimum voltage (0) of the voltages VA and VB to adjust the oscillation frequency of the VCO 12, one of the voltages VA and VB can be fixed to, for example, the maximum voltage (for example, VDD'), not the minimum voltage of the voltages VA and VB.

FIG. 9A depicts an example of control of the switches SW1 to SW5 and the switches SW11 to SW15 in a case where one of the voltages VA and VB is fixed to the maximum voltage while the other voltage is changed.

For example, in a case where the difference voltage VA−VB is changed so as to be decreased monotonically, only the switch SW1 among the switches SW1 to SW5 is turned on, while the switches SW11 to SW15 are turned on in the order of the switches SW15 to SW11.

In this case, the voltage VA is fixed to VDD', which is the maximum voltage of the voltages VA and VB, while the voltage VB changes from 0 to VDD'. As a result, the difference voltage VA−VB monotonically decreases from +VDD' (=VDD'−0) to 0 (=VDD'−VDD').

Turning on the switch S11 causes the voltage VB to be the maximum voltage VDD'. Thereafter, with the switch SW11 continuing to be on, the switches SW1 to SW5 are turned on in the order of the switches SW1 to SW5.

In this case, the voltage VB is fixed to VDD', which is the maximum voltage, while the voltage VA changes from VDD' to 0. As a result, the difference voltage VA−VB monotonically decreases from 0 (=VDD'−VDD') to −VDD' (=0−VDD').

In the above description, the switches SW1 to SW5 and the switches SW11 to SW15 are controlled such that one of the voltages VA and VB is fixed while the other voltage is changed. Alternatively, the switches SW1 to SW5 and the switches SW11 to SW15 can be controlled such that one of the voltages VA and VB is increased while the other voltage is decreased, for example.

FIG. 9B depicts an example of control of the switches SW1 to SW5 and the switches SW11 to SW15 in a case where one of the voltages VA and VB is increased while the other voltage is decreased.

For example, in a case where the difference voltage VA−VB is changed so as to be increased monotonically, the switches SW1 to SW5 are turned on in the order of the switches SW5 to SW1, while the switches SW11 to SW15 are turned on in the order of the switches SW11 to SW15.

In this case, the voltage VA changes from 0 to VDD', while the voltage VB changes from VDD' to 0. As a result, the difference voltage VA−VB monotonically increases from −VDD' (=0−VDD') to +VDD' (=VDD'-0).

It is noted that a decoding rule for decoding the frequency adjustment signal into the control signal needs to be set in the decoder 21, depending on which method is employed among the method in FIGS. 7, 8A, and 8B, the method in FIG. 9A, and the method in FIG. 9B as the method of controlling the switches SW1 to SW5 and the switches SW11 to SW15.

Further, with the method in FIGS. 7, 8A, and 8B, the voltage VA or VB is fixed to 0, that is, the ground. Therefore, it is possible to output 0 as the difference voltage VA−VB in a so to speak stable manner, as compared with the method in FIG. 9A where the voltage VA or VB is fixed to VDD' and the method in FIG. 9B where the voltages VA and VB are not fixed (when the difference voltage VA−VB changes).

<Exemplary Configuration of Current Source 61>

FIG. 10 is a circuit diagram depicting a first exemplary configuration of the current source 61 in FIG. 6.

In FIG. 10, the current source 61 includes cascode-connected p-channel FETs 71 and 72.

That is, in the current source 61, a source of the FET 71 is connected to the power supply VDD, while a drain of the FET 71 is connected to a source of the FET 72. Moreover, a drain of the FET 72 is connected to the resistor R1.

Gates of the FETs 71 and 72 included in the current source 61 receive a predetermined voltage from the outside of the current source 61.

That is, the gate of the FET 71 is connected to a gate of a p-channel FET 76 and a drain of a p-channel FET 77. A source of the FET 76 is connected to a power supply VDD. A source of the FET 77 is connected to a drain of the FET 76. One end of a current source 78 is grounded. A connection point between the gate of the FET 71, the gate of the FET 76, and the drain of the FET 77 is connected to the other end of the current source 78.

The gate of the FET 72 is connected to a gate of the FET 77, a gate of a p-channel FET 73, and a gate and a drain of a p-channel FET 74. A source of the FET 73 is connected to a power supply VDD. A source of the FET 74 is connected to a drain of the FET 73. One end of a current source 75 is grounded. A connection point between the gate of the FET 72, the gate of the FET 77, the gate of the FET 73, and the gate and drain of the FET 74 is connected to the other end of the current source 75.

The gates of the cascode-connected FETs 71 and 72 receive a voltage determined by both the FETs 73 and 74 and the current source 75 and the FETs 76 and 77 and the current source 78. A current corresponding to the voltage flows through the FETs 71 and 72 serving as the current source 61.

Figure 11:
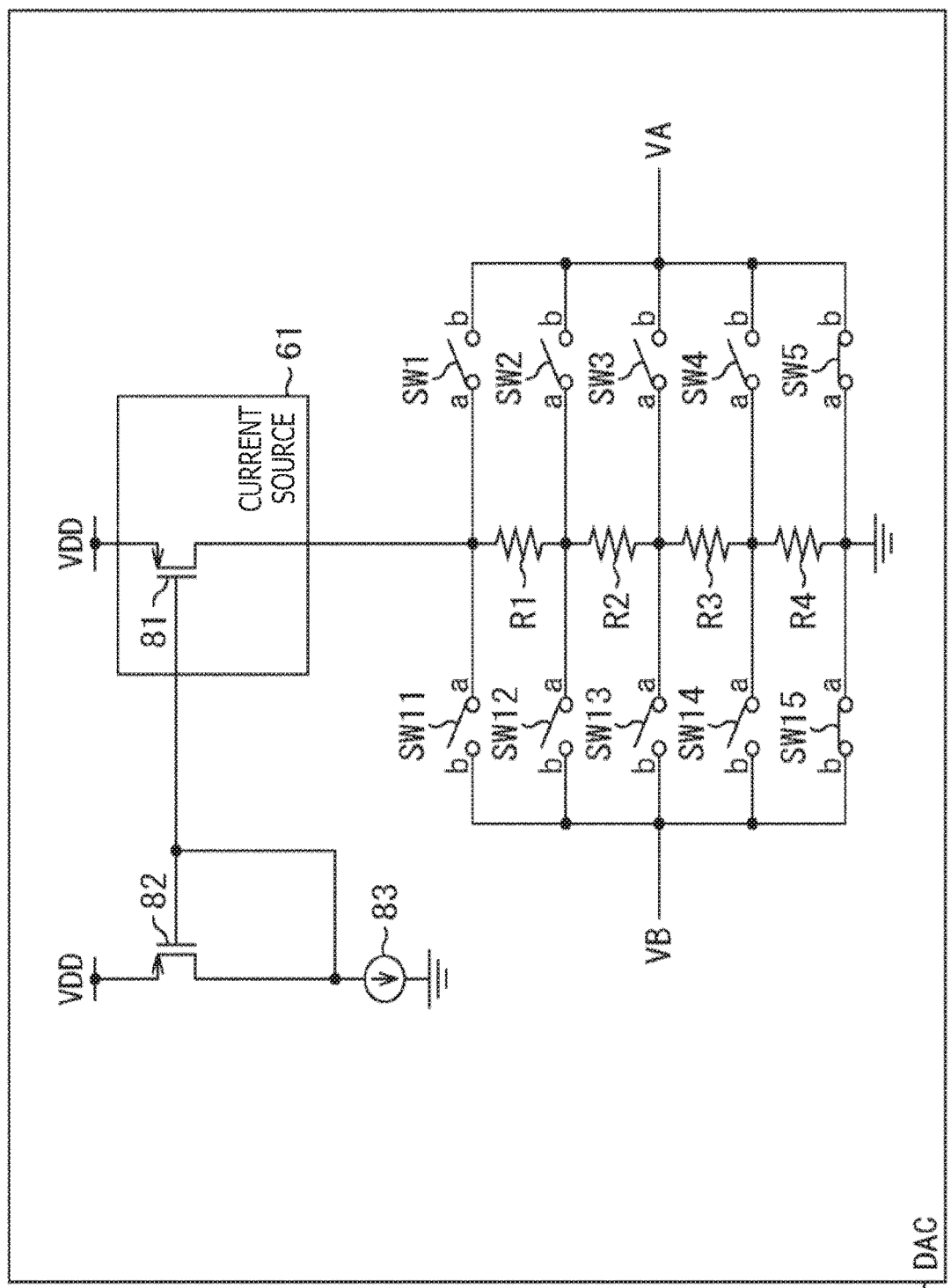
FIG. 11 is a circuit diagram depicting a second exemplary configuration of the current source 61.

FIG. 11 is a circuit diagram depicting a second exemplary configuration of the current source 61 in FIG. 6.

In FIG. 11, the current source 61 uses a current mirror. That is, the current source 61 includes a p-channel FET 81. The FET 81 is a transistor on the mirror side of the current mirror.

A source of the FET 81 is connected to the power supply VDD, while a drain of the FET 81 is connected to the resistor R1.

A gate of the FET 81 is connected to a gate and a drain of a p-channel FET 82. The FET 82 is a transistor that is a mirror source of the current mirror.

A source of the FET 82 is connected to a power supply VDD. One end of a current source 83 is grounded. A connection point between the gate of the FET 81 and the gate and drain of the FET 82 is connected to the other end of the current source 83.

The current mirror includes the FETs 81 and 82 and the current source 83. A current corresponding to a mirror ratio multiple times the current provided by the current source 83 flows through the FET 81.

Figure 12:
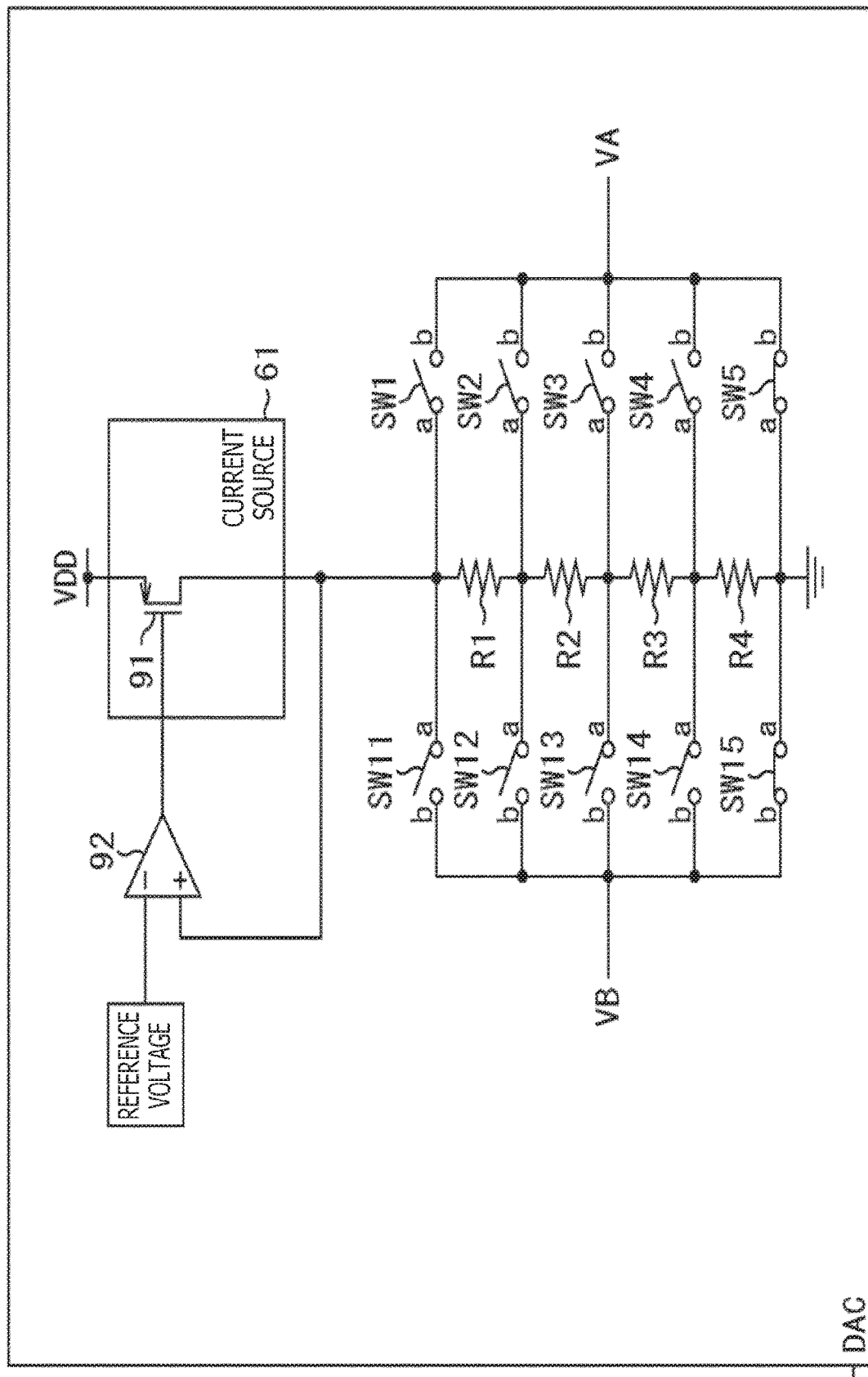
FIG. 12 is a circuit diagram depicting a third exemplary configuration of the current source 61.

FIG. 12 is a circuit diagram depicting a third exemplary configuration of the current source 61 in FIG. 6.

In FIG. 12, the current source 61 includes a p-channel FET 91 that allows current to flow according to a predetermined reference voltage.

A source of the FET 91 is connected to the power supply VDD, while a drain of the FET 91 is connected to the resistor R1.

A gate of the FET 91 is connected to an output terminal of an operational amplifier 92. A non-inverting input terminal (+) of the operational amplifier 92 is connected to a connection point between the drain of the FET 91 and the resistor R1.

Moreover, a predetermined reference voltage is applied to an inverting input terminal (−) of the operational amplifier 92.

A current flows through the FET 91 serving as the current source 61 such that the voltage at the non-inverting input terminal (+) of the operational amplifier 92 becomes (approximately) equal to the reference voltage applied to the inverting input terminal (−).

<Fourth Exemplary Configuration of DAC 22>

Figure 13:
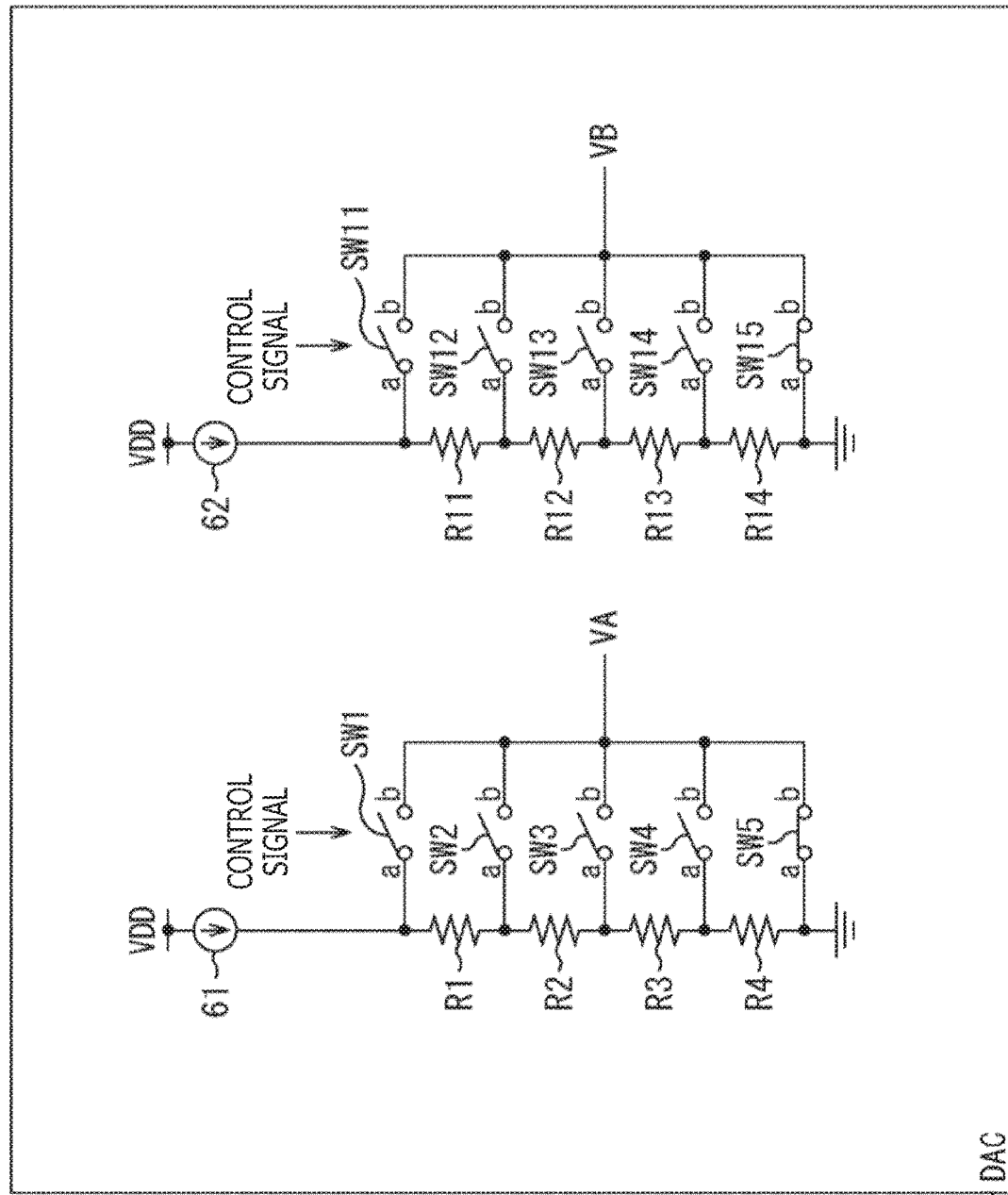
FIG. 13 is a circuit diagram depicting a fourth exemplary configuration of the DAC 22.

FIG. 13 is a circuit diagram depicting a fourth exemplary configuration of the DAC 22 in FIG. 2.

It is noted that in the figure, components corresponding to those in FIG. 6 are denoted with the same reference signs, and hereinafter, the description thereof will be appropriately omitted.

In FIG. 13, the DAC 22 includes the voltage-dividing resistors R1 to R4, the switches SW1 to SW5, the switches SW11 to SW15, voltage-dividing resistors R11 to R14, and the current source 61, and a current source 62.

Therefore, the DAC 22 in FIG. 13 is common to the DAC 22 in FIG. 6 in that the voltage-dividing resistors R1 to R4, the switches SW1 to SW5, the switches SW11 to SW15, and the current source 61 are provided.

However, the DAC 22 in FIG. 13 is different from the DAC 22 in FIG. 6 in that the voltage-dividing resistors R11 to R14 and the current source 62 are newly provided.

Here, the current source 62 is similar to the current source 61 described in FIG. 6 in that the DAC 22 in FIG. 13 can include the current source 62 (and the current source 61) or can be configured without the current source 62.

In FIG. 6, the switches SW1 to SW5 for outputting the voltage VA and the switches SW11 to SW15 for outputting the voltage VB are connected to the common resistors R1 to R4 serving as the dividing resistors. In FIG. 13, the voltage-dividing resistors to which the switches SW1 to SW5 are connected and the dividing resistors to which the switches SW11 to SW15 are connected are separate dividing resistors.

That is, in FIG. 13, the switches SW1 to SW5 are connected to the voltage-dividing resistors R1 to R4, similarly to the switches SW1 to SW5 in FIG. 6. By contrast, the switches SW11 to SW15 are connected to the voltage-dividing resistors R11 to R14. The voltage-dividing resistors R11 to R14 are provided separately from the voltage-dividing resistors R1 to R4.

Specifically, the voltage-dividing resistors R11 to R14 are connected in series in this order. One end of the current source 62 is connected to a power supply VDD. One end of the resistor R11, which is not connected to the resistor R12, is connected to the other end of the current source 62. One end of the resistor R14, which is not connected to the resistor R13, is grounded.

Moreover, the terminals a of the switches SW11 to SW14 are connected to respective terminals of the resistors R11 to R14, which are the terminals on the power supply VDD side of the resistors R11 to R14. The terminal a of the switch SW15 is connected to a terminal of the resistor R14, which is the terminal on the ground side of the resistor R14.

The DAC 22 configured as described above controls the switches SW1 to SW5 and the switches SW11 to SW15 similarly to the DAC 22 in FIG. 6, and outputs (the voltages VA and VB that can obtain) a wide range of the difference voltage VA−VB similar to the DAC 22 in FIG. 6.

Figure 14:
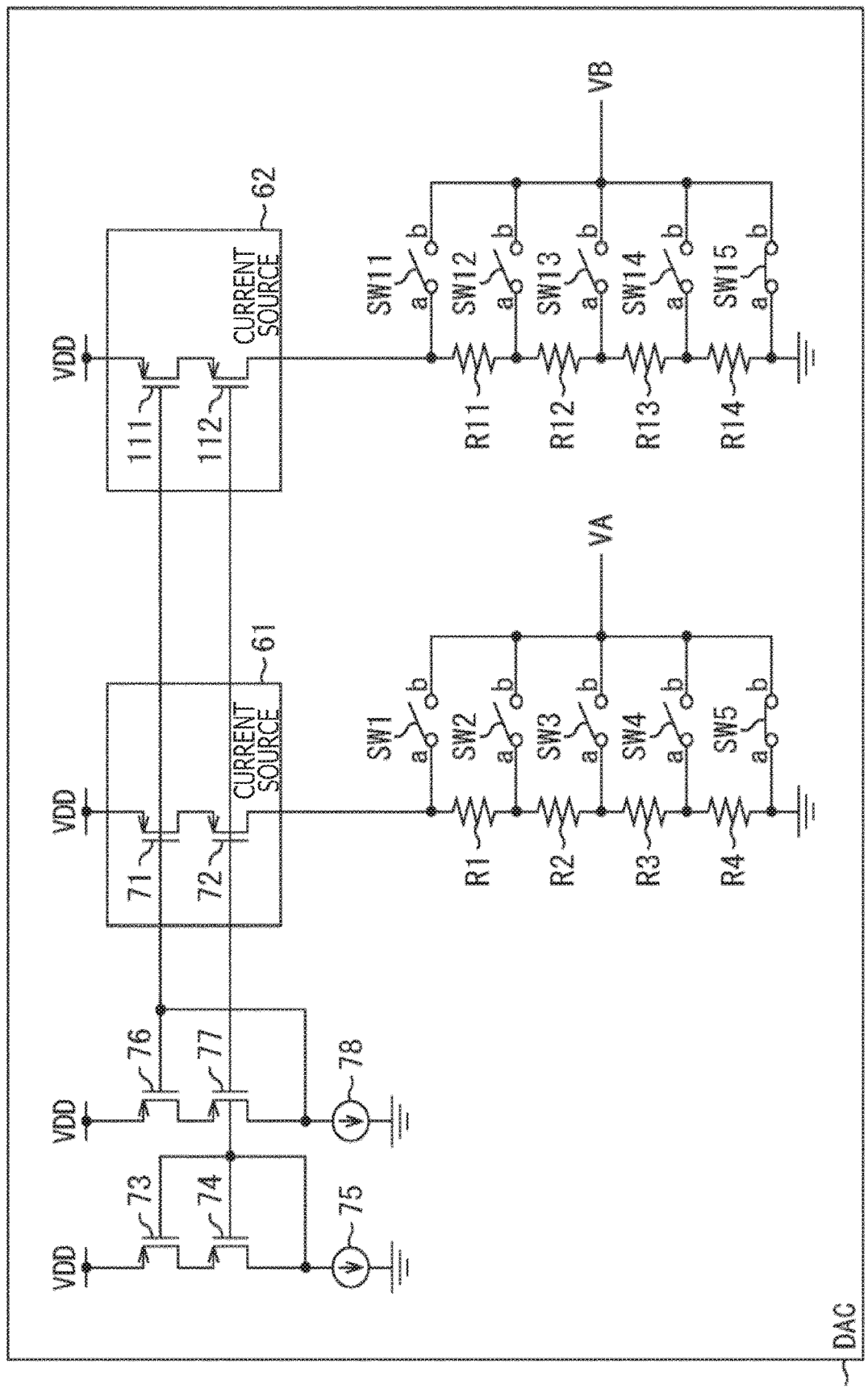
FIG. 14 is a circuit diagram depicting an exemplary configuration of a current source 62.

FIG. 14 is a circuit diagram depicting an exemplary configuration of the current source 62 in FIG. 13.

In FIG. 14, the current source 62 includes cascode-connected transistors, similarly to the current source 61 in FIG. 10.

That is, the current source 62 includes cascode-connected p-channel FETs 111 and 112.

In the current source 62, a source of the FET 111 is connected to the power supply VDD, while a drain of the FET 111 is connected to a source of the FET 112. Moreover, a drain of the FET 112 is connected to the resistor R11.

Gates of the FETs 111 and 112 included in the current source 62 receive the same voltage as the voltage applied to the current source 61 in FIG. 10 from the outside of the current source 62.

That is, the gates of the FETs 111 and 112 are connected to the gates of the FETs 71 and 72, respectively, and receive the same voltage as the voltage applied to the gates of the FETs 71 and 72, respectively.

As a result, a current similar to the current flowing through the FETs 71 and 72 serving as the current source 61 flows through the FETs 111 and 112 serving as the current source 62.

It is noted that alternatively, the current source 62 can use a current mirror (FIG. 10) or can include a transistor that allows the current to flow according to a predetermined reference voltage (FIG. 11), similarly to the current source 61, for example.

FIGS. 15A and 15B are diagrams depicting simulation results obtained by simulating the voltage division method in FIG. 3 and the voltage variable method in FIG. 6.

In FIGS. 15A and 15B, the horizontal axis represents the difference voltage VA−VB. The vertical axis represents the frequency (oscillation frequency) of the oscillation signal output by the oscillator 23 according to the difference voltage VA−VB.

FIG. 15A depicts a relationship between the difference voltage VA−VB and the oscillation frequency in the voltage division method. FIG. 15B depicts a relationship between the difference voltage VA−VB and the oscillation frequency in the voltage variable method.

In a case where the power supply voltage is 1.1 V, the range of the difference voltage VA−VB is −0.55 V to +0.55 V in the voltage division method, while the range of the difference voltage VA−VB is −0.7 V to +0.7 V in the voltage variable method.

As depicted in FIG. 6, the DAC 22 in the voltage variable method used in the simulation includes the current source 61.

Therefore, with the voltage variable method used for the simulation, the range of the difference voltage VA−VB is narrowed due to the voltage drop across the current source 61, similarly to the current source method in FIG. 4. Nevertheless, the voltage variable method can secure a wider range of the difference voltage VA−VB than the voltage division method.

It is noted that with the voltage division method in FIG. 15A, in a case where the difference voltage VA−VB is the minimum value −0.55 V of the range, the oscillation frequency is the minimum value Fmin (old), while in a case where the difference voltage VA−VB is the maximum value +0.55 V of the range, the oscillation frequency is the maximum value Fmax (old).

Further, with the voltage variable method in FIG. 15B, in a case where the difference voltage VA−VB is the minimum value −0.7 V of the range, the oscillation frequency is the minimum value Fmin (new), while in a case where the difference voltage VA−VB is the maximum value +0.7 V of the range, the oscillation frequency is the maximum value Fmax (new).

The minimum value Fmin (new) in the voltage variable method is smaller than the minimum value Fmin (old) in the voltage division method. The maximum value Fmax (new) in the voltage variable method is greater than the maximum value Fmax (old) in the voltage division method.

Therefore, the range (Fmin (new) to Fmax (new)) of the oscillation frequency in the voltage variable method is wider than the range (Fmin (old) to Fmax (old)) of the oscillation frequency in the voltage division method.

With the voltage variable method in FIG. 6 (and FIG. 13 alike), the current source 61 is provided. Therefore, it is possible to secure the PSRR (Power Supply Rejection Ratio). That is, it is possible to suppress the influence of the fluctuation of the power supply voltage VDD on the voltages VA and VB (that is, the difference voltage VA−VB) to be output from the DAC 22. As a result, it is possible to suppress the fluctuation of the oscillation frequency of the VCO 12 caused by the fluctuation of the power supply voltage VDD.

Further, the range of the difference voltage VA−VB in the current source method (FIG. 4) including the current source 61 is narrower than the range of the difference voltage VA−VB in the voltage division method (FIG. 3) without the current source 61 by the voltage drop across the current source 61. However, the voltage variable method can, even if the current source 61 is provided, secure a wide range of the difference voltage VA−VB equal to or greater than the range in the voltage division method.

It is noted that the embodiment of the present technology is not limited to the above-described embodiment, and various modifications can be made without departing from the scope of the present technology.

In addition, although in the present embodiment, description has been made with regard to the case where the present technology is applied to the VCO 12 that generates a millimeter-wave carrier, the present technology can also be applied to another technology that requires adjustment of the oscillation frequency, that is, a VCO or the like that constitutes a PLL (Phase Lock Loop), for example.

Further, the effects described in the present specification are merely examples and are not limitative, and other effects may be provided.

It is noted that the present technology can be configured as follows.

<1>
A DAC including:
a voltage-dividing resistor;
a plurality of first switches connected to the voltage-dividing resistor and each configured to output, as a first voltage, a voltage at a corresponding one of connection points between the voltage-dividing resistor and the plurality of first switches; and
a plurality of second switches connected to the voltage-dividing resistor and each configured to output, as a second voltage, a voltage at a corresponding one of connection points between the voltage-dividing resistor and the plurality of second switches.

<2>
The DAC according to <1>, in which the plurality of first switches and the plurality of second switches are controlled such that one voltage among the first voltage and the second voltage is fixed while another voltage among the first voltage and the second voltage is changed.

<3>
The DAC according to <2>, in which the plurality of first switches and the plurality of second switches are controlled such that the one voltage is fixed to a minimum voltage or a maximum voltage of the first voltage and the second voltage while the other voltage is changed.

<4>
The DAC according to <1>, in which the plurality of first switches and the plurality of second switches are controlled such that one voltage among the first voltage and the second voltage is increased while another voltage among the first voltage and the second voltage is decreased.

<5>
The DAC according to any one of <1> to <4>,
in which the voltage-dividing resistor includes a plurality of resistors,
the plurality of resistors is connected in series, and
the plurality of first switches and the plurality of second switches are connected to respective terminals of the plurality of resistors connected in series.

<6>
The DAC according to any one of <1> to <5>, in which the voltage-dividing resistor includes separate resistors connected to the first switches and connected to the second switches.

<7>
The DAC according to any one of <1> to <6>, further including:
a current source configured to provide a current to the voltage-dividing resistor.

<8>
The DAC according to <7>, in which the current source includes cascode-connected transistors.

<9>
The DAC according to <7>, in which the current source uses a current mirror.

<10>
The DAC according to <7>, in which the current source includes a transistor configured to provide the current according to a predetermined reference voltage.

<11>
An oscillation circuit including:
a DAC configured to output a first voltage and a second voltage; and
an oscillator configured to oscillate a signal with a frequency corresponding to a difference voltage, the difference voltage being a difference between the first voltage and the second voltage,
in which the DAC includes
a voltage-dividing resistor,
a plurality of first switches connected to the voltage-dividing resistor and each configured to output, as the first voltage, a voltage at a corresponding one of connection points between the voltage-dividing resistor and the plurality of first switches, and
a plurality of second switches connected to the voltage-dividing resistor and each configured to output, as the second voltage, a voltage at a corresponding one of connection points between the voltage-dividing resistor and the plurality of second switches.

REFERENCE SIGNS LIST

11 Amplifier, 12 VCO, 13 Mixer, 14 Amplifier, 21 Decoder, 22 DAC, 23 Oscillator, 30 Current source, 31, 32 FET, 33, 34 Coil, 35, 36 Capacitor, 37, 38 Varactor diode, 39 to 41 Resistor, 51, 52 Capacitor, 61, 62 Current source, 71 to 74 FET, 75 Current source, 76, 77 FET, 78 Current source, 81, 82 FET, 83 Current source, 91 FET, 92 Operational amplifier, 111, 112 FET

The invention claimed is:
1. An apparatus, comprising:
a digital to analog converter (DAC) that includes:
a first voltage-dividing resistor;
a plurality of first switches connected to the first voltage-dividing resistor, wherein
each first switch of the plurality of first switches is configured to output, as a first voltage, a voltage at a corresponding connection point of a plurality of first connection points, and
the plurality of first connection points is between the first voltage-dividing resistor and the plurality of first switches; and
a plurality of second switches connected to the first voltage-dividing resistor, wherein
each second switch of the plurality of second switches is configured to output, as a second voltage, a voltage at a corresponding connection point of a plurality of second connection points, and
the plurality of second connection points is between the first voltage-dividing resistor and the plurality of second switches; and
a decoder configured to transmit a control signal to the DAC, wherein
the control signal is based on a frequency adjustment signal for adjustment of an oscillation signal of an oscillator,
one of the plurality of first switches or the plurality of second switches are sequentially turned on from a power supply side of the one of the plurality of first switches or the plurality of second switches, respectively, based on the control signal, and
the plurality of first switches and the plurality of second switches are controlled such that the first voltage is fixed and the second voltage is changed.

2. The apparatus according to claim 1, wherein the plurality of first switches and the plurality of second switches are controlled such that the first voltage is fixed to one of a minimum voltage or a maximum voltage of the first voltage and the second voltage.

3. The apparatus according to claim 1, wherein
the first voltage-dividing resistor includes a plurality of resistors,
the plurality of resistors is connected in series, and the plurality of first switches and the plurality of second switches are connected to respective terminals of the plurality of resistors.

4. The apparatus according to claim 1, wherein the first voltage-dividing resistor comprises a second voltage-dividing resistor and a third voltage-dividing resistor, wherein
the second voltage-dividing resistor is connected to the plurality of first switches, and
the third voltage-dividing resistor is connected to the plurality of second switches.

5. The apparatus according to claim 1, further comprising:
a current source configured to provide a current to the first voltage-dividing resistor.

6. The apparatus according to claim 5, wherein the current source includes cascode-connected transistors.

7. The apparatus according to claim 5, wherein the current source comprises a current mirror.

8. The apparatus according to claim 5, wherein the current source includes a transistor configured to provide the current based on a reference voltage.

9. An oscillation circuit, comprising:
a digital to analog converter (DAC) configured to output a first voltage and a second voltage; and
an oscillator configured to oscillate an oscillation signal with a frequency corresponding to a difference voltage, wherein
the difference voltage is a difference between the first voltage and the second voltage, and
the DAC includes:
a voltage-dividing resistor;
a plurality of first switches connected to the voltage-dividing resistor, wherein
each first switch of the plurality of first switches is configured to output, as the first voltage, a voltage at a corresponding connection point of a plurality of first connection points, and
the plurality of first connection points is between the voltage-dividing resistor and the plurality of first switches; and
a plurality of second switches connected to the voltage-dividing resistor, wherein
each second switch of the plurality of second switches is configured to output, as the second voltage, a voltage at a corresponding connection point of a plurality of second connection points, and
the plurality of second connection points is between the voltage-dividing resistor and the plurality of second switches; and
a decoder configured to transmit a control signal to the DAC, wherein
the control signal is based on a frequency adjustment signal for adjustment of the oscillation signal of the oscillator,
one of the plurality of first switches or the plurality of second switches are sequentially turned on from a power supply side of the one of the plurality of first switches or the plurality of second switches, respectively, based on the control signal, and
the plurality of first switches and the plurality of second switches are controlled such that the first voltage is fixed and the second voltage is changed.

\* \* \* \* \*